(12) United States Patent
Goh et al.

(10) Patent No.: US 11,764,084 B2
(45) Date of Patent: Sep. 19, 2023

(54) SURFACE TREATMENT APPARATUS AND SURFACE TREATMENT METHOD

(71) Applicant: SEMES CO., LTD., Cheonan-si (KR)

(72) Inventors: Jung Suk Goh, Hwaseong-si (KR); Sun Mi Kim, Jeollanam-do (KR); Ji Su Hong, Asan-si (KR); Kuk Saeng Kim, Goyang-si (KR); Cheng Bin Cui, Suwon-si (KR); Pil Kyun Heo, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 169 days.

(21) Appl. No.: 16/951,718

(22) Filed: Nov. 18, 2020

(65) Prior Publication Data
US 2021/0159092 A1 May 27, 2021

(30) Foreign Application Priority Data
Nov. 22, 2019 (KR) .......................... 10-2019-0151301

(51) Int. Cl.
*H01L 21/67* (2006.01)
*B08B 3/04* (2006.01)

(52) U.S. Cl.
CPC .......... *H01L 21/6708* (2013.01); *B08B 3/041* (2013.01); *H01L 21/67253* (2013.01)

(58) Field of Classification Search
CPC ...................... H01L 21/6708; H01L 21/67051
See application file for complete search history.

(56) References Cited

U.S. PATENT DOCUMENTS

| | | | |
|---|---|---|---|
| 4,029,578 A | 6/1977 | Turk | |
| 5,934,566 A | 8/1999 | Kanno et al. | |
| 2002/0035762 A1* | 3/2002 | Okuda | B08B 3/02 134/102.1 |
| 2002/0189641 A1* | 12/2002 | Sato | B08B 3/02 134/36 |
| 2012/0325274 A1* | 12/2012 | Kai | H01L 21/67051 134/102.1 |
| 2013/0052360 A1* | 2/2013 | Maegawa | B05C 11/08 118/612 |
| 2015/0020850 A1* | 1/2015 | Kato | H01L 21/02052 134/4 |
| 2017/0028413 A1* | 2/2017 | Oh | B05B 7/10 |

FOREIGN PATENT DOCUMENTS

| | | |
|---|---|---|
| JP | 38318181 | 12/1996 |
| JP | 1444557 | 3/2004 |
| KR | 1020090115238 | 11/2009 |

* cited by examiner

*Primary Examiner* — Natasha N Campbell

(57) ABSTRACT

Disclosed is a substrate treatment apparatus. The apparatus includes a support unit that supports and rotates a substrate and a spray unit equipped with one or more nozzles to spray a dual fluid that is a mixture of a cleaning agent and carbon dioxide onto the substrate.

9 Claims, 9 Drawing Sheets

SURFACE TREATMENT APPARATUS AND SURFACE TREATMENT METHOD

CROSS REFERENCE TO RELATED APPLICATION

The present application claims priority to Korean Patent Application No. 10-2019-0151301, filed Nov. 22, 2019, the entire contents of which are herein incorporated by this reference.

BACKGROUND OF THE INVENTION

1. Field of the Invention

The present invention relates to a substrate treatment apparatus and a surface treatment method. More particularly, the present invention relates to a substrate treatment apparatus and a substrate treatment method that may be used to manufacture semiconductor devices.

2. Description of the Related Art

Semiconductor devices are manufactured through a number of processes performed on a semiconductor substrate. The surface of the semiconductor substrate is likely to be contaminated with impurities during each of the processes. For example, since a silicon wafer, a glass panel, or a large flat panel for PDP or LCD is contaminated with impurities during manufacturing processes, a cleaning process is essentially required to remove the impurities.

Cleaning methods for semiconductor substrates are largely divided into a wet chemical method, a dry chemical method, and a vapor phase method. Traditional wafer cleaning methods were mostly wet chemical methods using a hydrogen peroxide solution but dry chemical methods or vapor phase methods are now preferably used because disadvantages of the wet chemical methods, including consumption of many chemicals, difficulty in disposing used materials, and incompatibility with advanced manufacturing processes.

A conventional wet cleaning method for removing impurities from a semiconductor substrate is RCA cleaning which is a set of cleaning steps that respectively use ammonia hydrogen peroxide, aqueous fluoric acid, and hydrogen peroxide. On the other hand, a conventional dry cleaning method removes impurities on a substrate through evaporation of metallic contaminants (i.e., metal chlorides) by using chlorine radicals generated through ultraviolet (UV) irradiation. That is, conventional cleaning techniques to treat the surface of a substrate include a method of using a large amount of aqueous solution or harmful solution, a method of activating ozone through ultra-violet radiation (for example, UV-$O_3$ cleaning technique), or a method of generating oxygen plasma in a vacuum environment.

Among these conventional substrate cleaning methods, an ozone water treatment method is used to remove specifically a photoresist film on a substrate. In the process, ozone water is directly sprayed onto a substrate through nozzles or is supplied to the substrate in the form of steam. During the ozone water treatment process, when a wafer (i.e., substrate) rotates at a low speed, it is difficult to remove contaminants present in a periphery area of the surface of the wafer due to a pooling phenomenon in which ozone water does not spread well but tends to gather in a center portion of the surface of the wafer.

Specifically, in the case of ozone steam feeding, there is a problem in that the solubility of ozone is reduced due to an increased temperature of the steam. Therefore, this method cannot provide high cleaning efficiency. On the other hand, in the case of direct spraying of cleaning fluid (for example, ozone water), since the cleaning fluid does not strongly strike the substrate, this method also cannot provide high cleaning efficiency.

Documents of Related Art

Patent Document (Patent Document 1) U.S. Pat. No. 4,029,578

SUMMARY OF THE INVENTION

An objective of the present invention is to provide a substrate treatment apparatus and a substrate treatment method that may increase cleaning efficiency.

One aspect of the present invention provides a substrate treatment apparatus including: a support unit that supports a substrate and rotates the substrate supported thereon; and a spray unit including one or more nozzles configured to spray a dual fluid that is a mixture of a cleaning agent and carbon dioxide onto the substrate.

The spray unit may include: a cleaning agent supply member connected to the nozzle and configured to supply the cleaning agent to the nozzle; and a carbon dioxide supply member connected to the nozzle and configured to supply carbon dioxide to the nozzle.

The apparatus may further include: a rotation speed measuring member configured to measure a rotation speed of a substrate rotating portion of the support unit; and a controller configured to adaptively control the number of the nozzles from which the dual fluid is to be sprayed onto the substrate on the basis of the rotation speed measured by the rotation speed measuring member.

The controller may perform control such that two or more nozzles of the nozzles are used to spray the dual fluid when the rotation speed measured by the rotation speed measuring member is lower than a target rotation speed.

On the other hand, when the rotation speed measured by the rotation speed measuring member is equal to or higher than the target rotation speed, the controller may perform control such that a single nozzle of the nozzles is used to spray the dual fluid onto the substrate.

The apparatus may include: a flow velocity measuring member installed in the spray unit and configured to measure a flow velocity of the dual fluid; and a controller configured to control a pressure of the carbon dioxide to be mixed with the cleaning agent on the basis of the flow velocity measured by the flow velocity measuring member.

The controller may perform a control operation by which the pressure of the carbon dioxide to be mixed with the cleaning agent is increased when the flow velocity measured by the flow velocity measuring member is lower than a target flow velocity.

The controller may perform a control operation by which a notification indicating that the flow velocity is in a normal state is output when the flow velocity measured by the flow velocity measuring member is equal to or higher than a target flow velocity.

The cleaning agent may have a temperature within a range of 1° C. to 10° C.

The cleaning agent may be ozone water.

Another aspect of the present invention provides a substrate treatment method including: rotating a substrate; measuring a rotation speed of the substrate; determining the number of nozzles to be used on the basis of the measured rotation speed of the substrate; and spraying a dual fluid composed of a cleaning agent and carbon dioxide onto the substrate.

The determining of the number of the nozzles may be performed to select two or more nozzles of the nozzles when the measured rotation speed of the substrate is lower than a target rotation speed.

The determining of the number of the nozzles may be performed to select one nozzle of the nozzles when the measured rotation speed of the substrate is higher than a target speed.

The method may further include: measuring a flow velocity of the dual fluid; and controlling a pressure of the carbon dioxide on the basis of the measured flow velocity.

The controlling of the pressure of the carbon dioxide may be performed to increase the pressure of the carbon dioxide to be mixed with the cleaning agent when the measured flow velocity is lower than a target flow velocity.

The controlling of the pressure of the carbon dioxide may be performed to output a notification indicating that the flow velocity is in a normal state when the measured flow velocity is equal to or higher than a target flow velocity.

One embodiment of the present invention provides a substrate treatment apparatus including: a support unit including a support plate configured to support a substrate and a rotary motor configured to rotate the support plate; and a spray unit including one or more nozzles configured to spray a dual fluid onto the substrate, the dual fluid being a mixture of a cleaning agent supplied from a cleaning agent supply member and carbon dioxide supplied from a carbon dioxide supply member. The nozzle includes: a first supply portion through which the cleaning agent is supplied from the cleaning fluid supply member; and a second supply portion through which the carbon dioxide supplied from the carbon dioxide supply member. The second supply may be configured to surround the first supply unit at an end of the nozzle.

The cleaning agent supply member includes: a cleaning liquid storage tank in which a cleaning agent is stored; a first pipe connecting the cleaning liquid storage tank and the nozzle with each other; a static pressure valve configured to maintain a pressure of the cleaning agent supplied to the nozzle; a flow meter configured to measure a flow rate of the cleaning agent supplied from the cleaning agent storage tank to the nozzle; and a shut-off valve or needle valve configured to block or allow supply of cleaning liquid to the nozzle.

The carbon dioxide supply member includes: a carbon dioxide storage tank in which carbon dioxide is stored, a second pipe connecting the carbon dioxide storage tank and the nozzle with each other, and a regulator installed in the second pipe so that the carbon dioxide is discharged at a constant pressure.

The spray unit may include a gripping member that grips the nozzles and a turning member that turns the gripping member to be shuttled between a storage position and a substrate position.

According to the present invention, the substrate treatment apparatus includes the spray unit that sprays a dual fluid that is a mixture of a cleaning agent and carbon dioxide onto a substrate. As the concentration of ozone is increased, the performance of cleaning the substrate is improved. The concentration of ozone may be maintained high until the dual fluid comes into contact with the substrate after being sprayed from the spray unit. The substrate treatment apparatus according to one embodiment of the present invention may increase a cleaning efficiency compared to conventional substrate treatment apparatuses.

The substrate treatment apparatus according to one embodiment of the present invention may spray a dual fuel toward a substrate at a high velocity, thereby increasing the force of hitting the substrate to increase a cleaning efficiency. The substrate treatment apparatus according to one embodiment of the present invention may prevent the concentration of zone from being reduced by using carbon dioxide, thereby increasing a cleaning efficiency while using a chemical cleaning method. That is, the substrate treatment apparatus according to one embodiment of the present invention may significantly improve the cleaning efficiency by using both physical and chemical methods compared to conventional substrate treatment apparatuses.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE PREFERRED EMBODIMENTS

Figure 1:
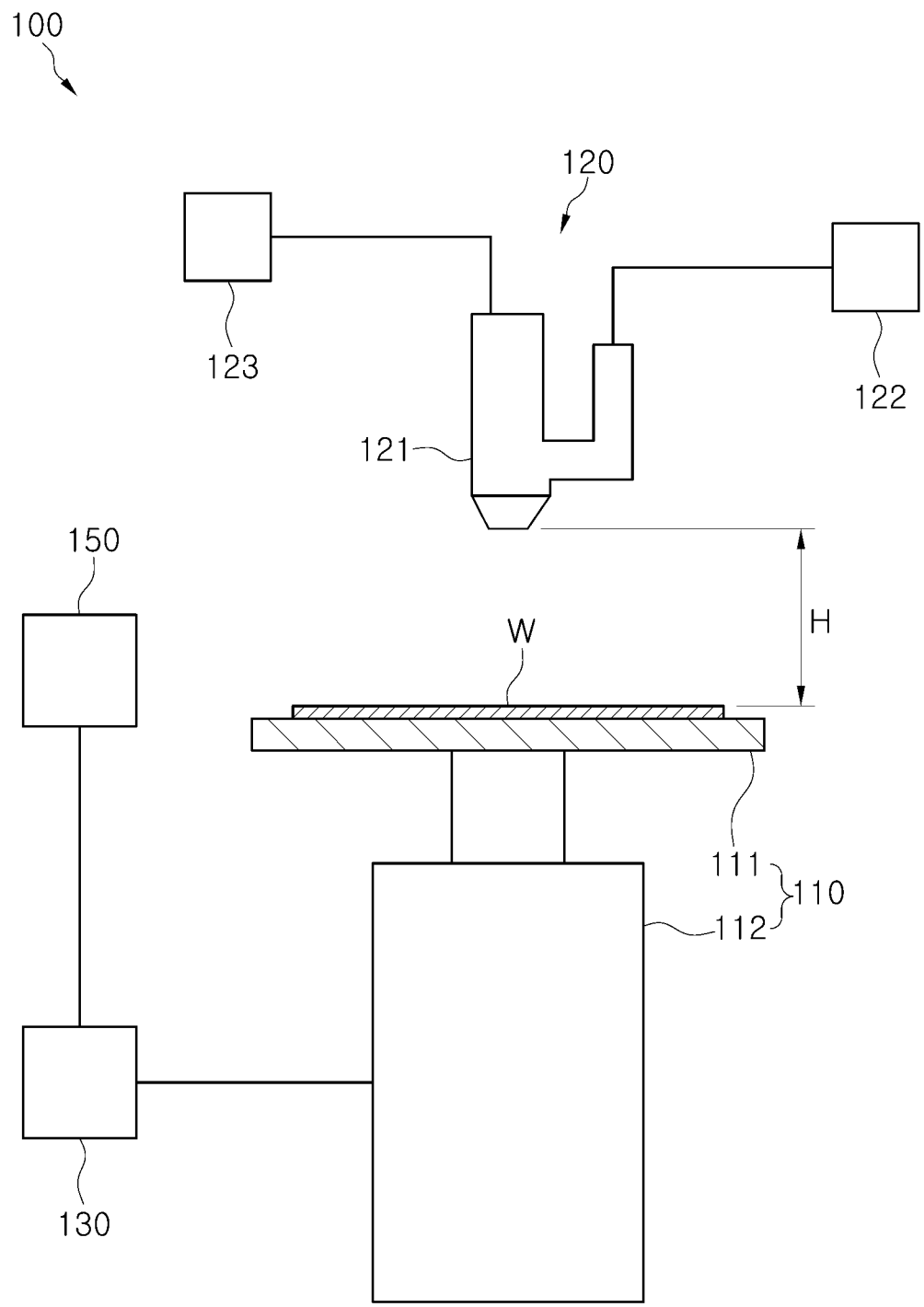
FIG. 1 is a configuration view illustrating a substrate treatment apparatus according to one embodiment of the present invention.
Figure 2:
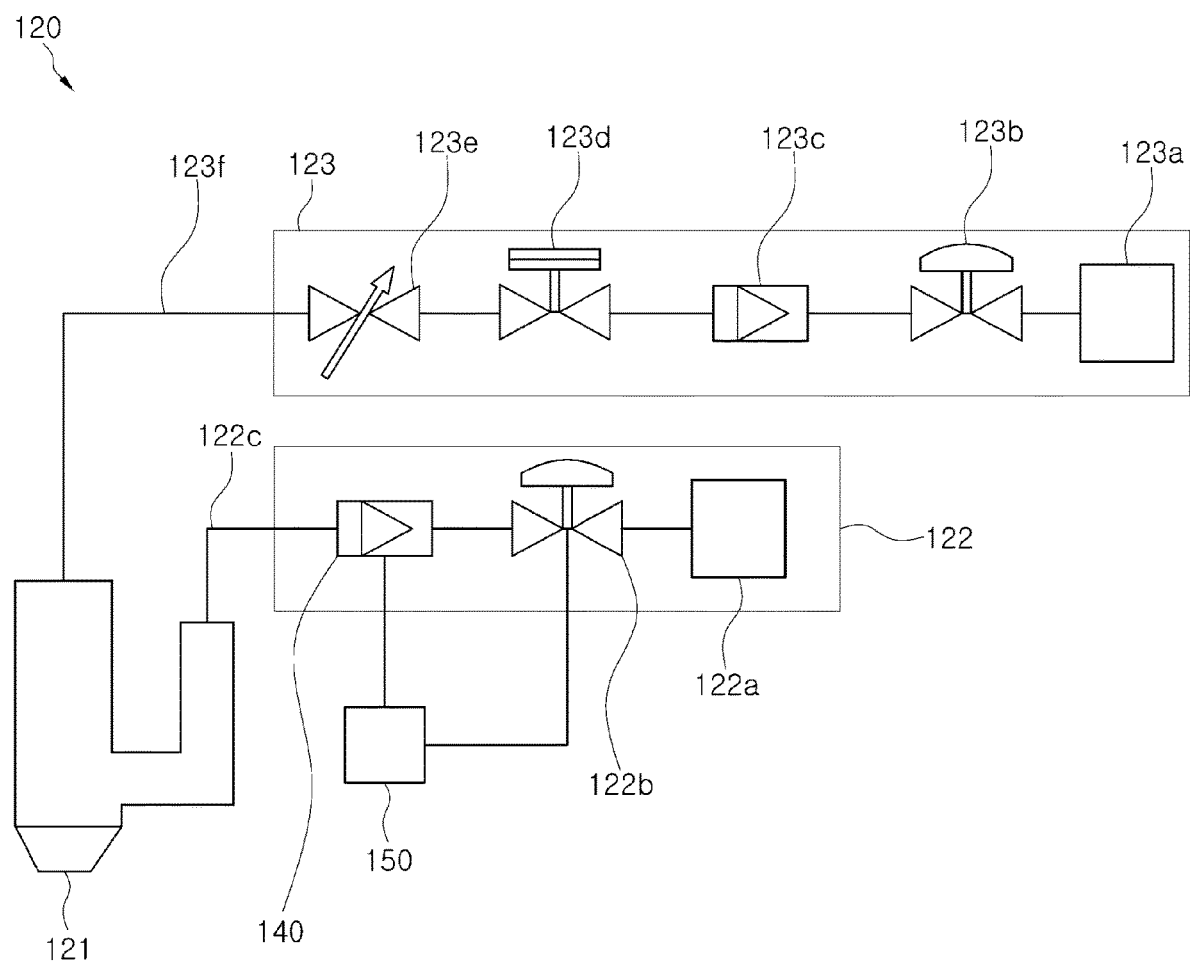
FIG. 2 is a configuration view illustrating a spray unit.

Hereinbelow, exemplary embodiments of the present invention will be described in detail with reference to the accompanying drawings such that the invention may be easily practiced by those ordinarily skilled in the art to which the present invention pertains. The present invention may be embodied in various forms and should not be construed as being limited to the exemplary embodiments disclosed herein.

A description of elements that are not related to the invention will be omitted to clarify the invention, and identical or similar elements are denoted by identical or similar reference characters throughout the drawings and the detailed description below.

In various embodiments, components having the same configuration will be denoted by the same reference numerals, and only a representative embodiment will be described. For the other exemplary embodiments, only components that differ from those of the representative embodiment will not be described.

When an element is described as being "connected to", "combined with", or "coupled to" another element, it should be understood that the element may be connected to, combined with, or coupled to another element directly or with another element interposing therebetween.

It will be further understood that the terms "comprises", "comprising", "includes", and/or "including," when used herein, specify the presence of stated features, integers, steps, operations, elements, and/or components, but do not preclude the presence or addition of one or more other features, integers, steps, operations, elements, components, and/or groups thereof.

In addition, unless otherwise defined, all terms including technical and scientific terms used herein have the same meaning as commonly understood by those who are ordinarily skilled in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Referring to FIGS. 1 to 4, according to one embodiment of the present invention, a substrate treatment apparatus 100 includes a support unit 110 and a spray unit 120.

The support unit 110 supports a substrate W and rotates the substrate W supported thereon. The support unit 110 includes, for example, a support plate 111 and a rotary motor 112.

The support plates 111 supports the substrate W. The support plate 111 is larger in size than the substrate S. When the substrate is a circular wafer, the support plate 111 may be a circular plate having a larger diameter than the wafer.

The rotary motor 112 is positioned below the support plate 111. The rotary motor 112 rotates the support plate 111.

When the substrate W is seated on the support plate 111 and then the support plate 111 is rotated, the substrate W on the support plate 111 is also rotated. In this state, when a chemical solution is ejected to a center portion of the substrate W, the chemical solution spreads to the edge of the substrate W due to centrifugal force.

Figure 7:
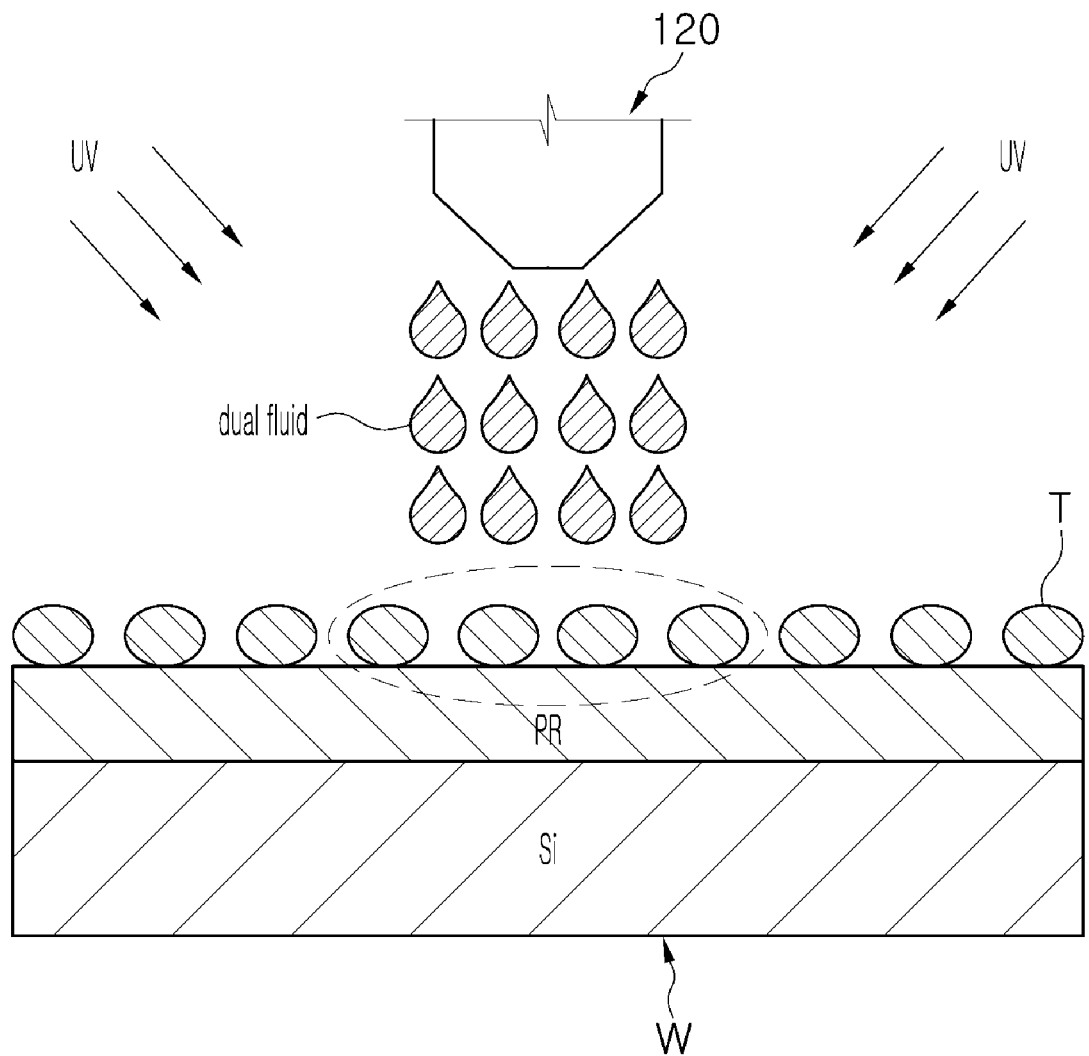
FIG. 7 is a diagram illustrating a state in which a dual fluid strikes a foreign particle on a substrate in a substrate treatment apparatus.

The spray unit 120 includes one or more nozzles 121 for spraying a dual fluid to the substrate W. Herein, the dual fluid refers to a fluid mixture of cleaning agent and carbon dioxide. While the spray unit 120 sprays the dual fluid to the substrate, the substrate W may be optionally irradiated with ultraviolet radiation (see FIG. 7).

The substrate treatment apparatus 100 according to one embodiment of the present invention includes a spray unit 120 equipped with one nozzle 121 and a spray unit 120 equipped with multiple nozzles 121. Alternatively, according to one embodiment of the present invention, the substrate treatment apparatus 100 may include a spray unit 120 equipped with multiple nozzles 121 that may be selectively or collectively used.

The spray unit 120 includes, for example, one or more nozzles 121, a cleaning agent supply member 123, and a carbon dioxide supply member 122.

Figure 3:
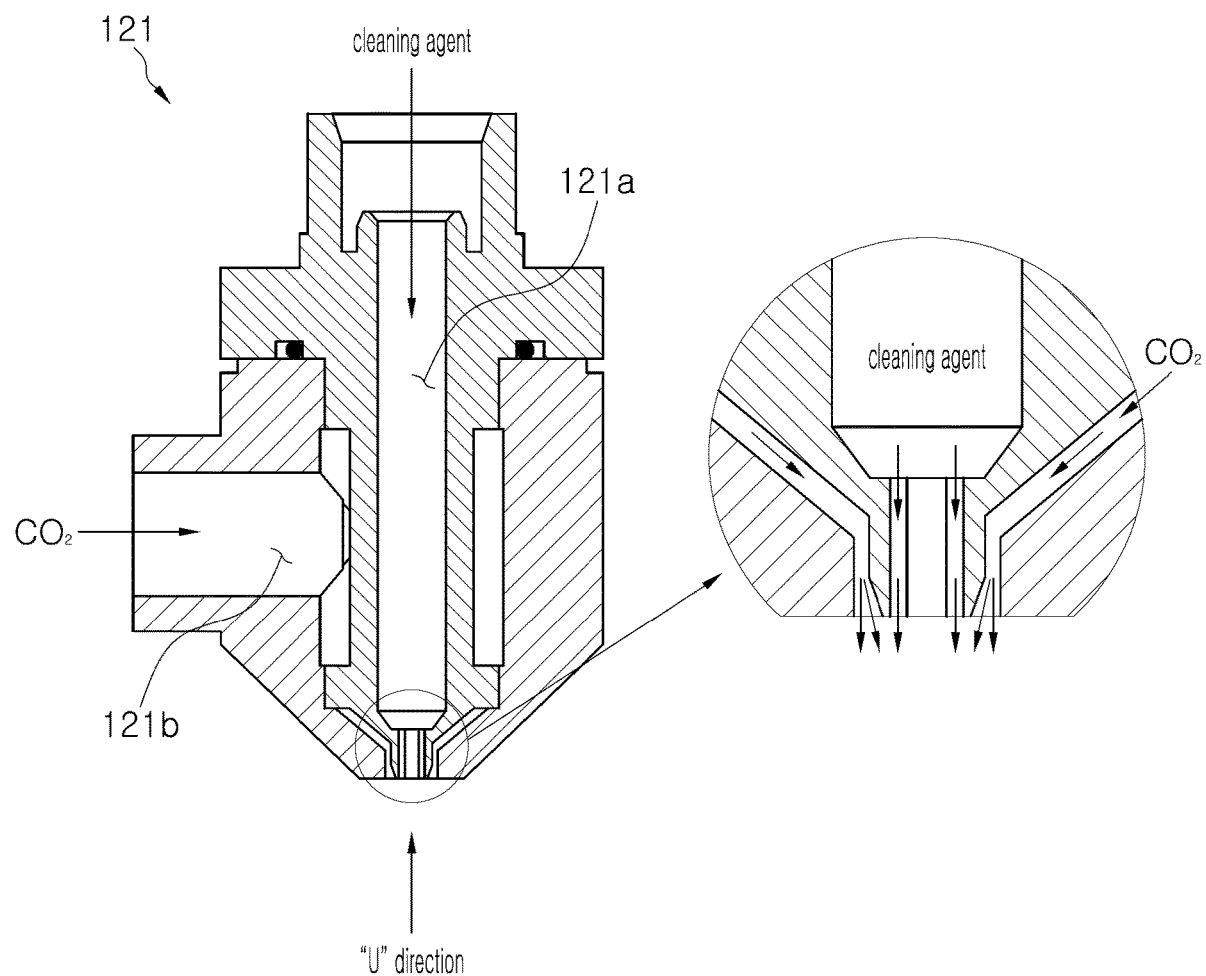
FIG. 3 is a view illustrating an internal structure of a nozzle included in the spray unit of FIG. 2.
Figure 4:
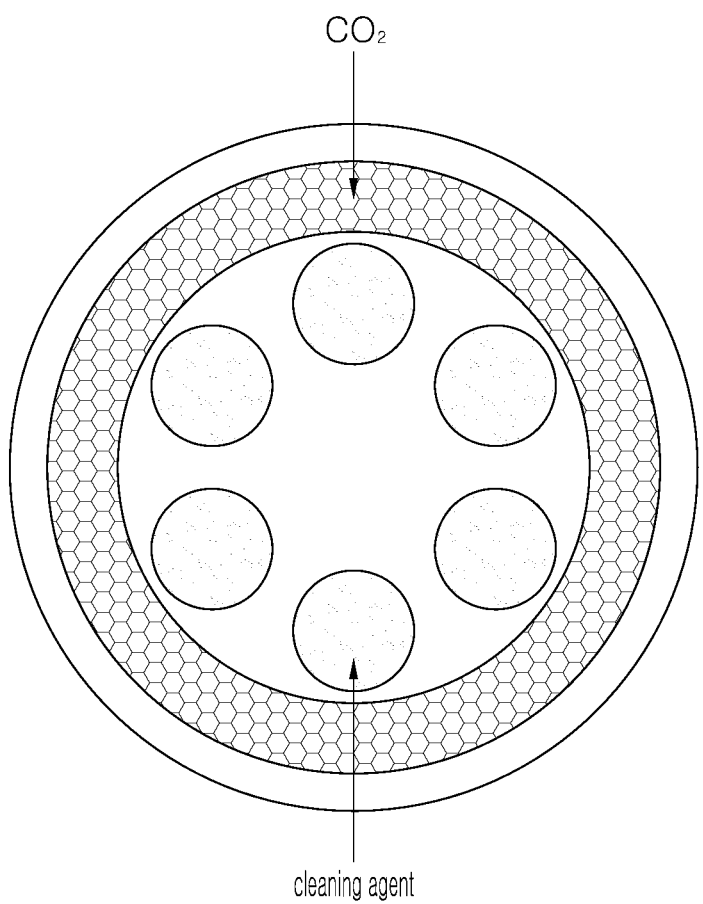
FIG. 4 is a view illustrating the spray unit viewed from the direction "U" of FIG. 3.

The nozzle 121 is configured to spray the cleaning agent and the carbon dioxide toward the substrate W. Referring to FIGS. 3 and 4, the nozzle 121 includes a first supply portion 121a through which a cleaning agent is introduced and a second supply portion 121b through which carbon dioxide is introduced.

At an end of the nozzle 121, the first supply portion 121a is surrounded by a portion of the second supply portion 121b. Carbon dioxide is sprayed at around a jet of the cleaning agent. Therefore, the carbon dioxide is mixed with the cleaning agent while the carbon dioxide is sprayed toward the substrate W, and the speed of the cleaning agent sprayed toward the substrate W is increased due to a high speed of the carbon dioxide sprayed toward the substrate W.

The cleaning agent supply member 123 is connected to the nozzle 121. The cleaning agent supply member 123 is configured to feed the cleaning agent to the nozzle 121. The cleaning agent used to clean the substrate W is, for example, ozone water. When a mixture of ozone water and carbon dioxide is sprayed onto the substrate W, the rate of dissociation of ozone on the substrate W is reduced due to the presence of the carbon dioxide.

When carbon dioxide and ozone water (cleaning agent) are mixed, reactions indicated by Reaction Formulas below occur.

$$CO_2 + H_2O \leftrightarrow HCO_3 + H^+$$

$$HCO_3{-} \leftrightarrow CO_3^{2-} + H^+$$

$$CO_3^{2-} + OH\cdot \leftrightarrow CO_3{-}\cdot + OH^-$$

$$CO_3{-}\cdot + OH\cdot \leftrightarrow CO_2 + HO_2{-}$$

$$O_3 + HO_2{-} \leftrightarrow OH\cdot + O_2{-}\cdot + O_2$$

As can be seen from the above reaction formulas, carbon dioxide ($CO_2$) and ozone water (i.e., cleaning agent) react to produce subcarbonate ($HCO_3$), and then the subcarbonate is converted into carbonate ($CO_3^{2-}$). This carbonate prevents the dissociation of ozone ($O_3$).

More specifically, the cleaning agent supply member 123 includes a cleaning agent storage tank 123a, a first pipe 123f, a static pressure valve 123b, a flow meter 123c, a shut-off valve 123d, and a needle valve 123e.

The cleaning agent storage tank 123a stores the cleaning agent. The first pipe 123f connects the cleaning agent storage tank 123a to the nozzle 121.

The static pressure valve 123b maintains the pressure of the pipe when the cleaning agent is supplied to the nozzle 121. The flow meter 123c measures the flow rate of the cleaning agent supplied to the nozzle 121 from the cleaning agent storage tank 123a.

The shut-off valve 123d blocks and allows the flow of the cleaning agent toward the nozzle. The needle valve 123e is a valve operated by an external force. A user may manually block or allow the flow of the cleaning agent toward the nozzle.

The cleaning agent supply member 123 is configured to stably feed the cleaning agent to the nozzle 121.

The carbon dioxide supply member 122 is connected to the nozzle 121 and supplies carbon dioxide to the nozzle 121. The carbon dioxide supply member 122 includes a carbon dioxide storage tank 122a, a second pipe 122c, and a regulator 122b.

The carbon dioxide storage tank 122a stores carbon dioxide. The second pipe 122c connects the carbon dioxide storage tank 122a to the nozzle 121. The regulator 122b is configured to discharge carbon dioxide from the carbon dioxide storage tank 122a at a constant pressure.

The carbon dioxide supply member 122 is configured to stably supply carbon dioxide to the nozzle 121.

On the other hand, when the spray unit 120 includes multiple nozzles 121, the carbon dioxide supply member 122 includes multiple regulators 122b respectively connected to the multiple nozzles 121. The multiple regulators 122b regulate the flow velocity of a dual fluid sprayed from the multiple nozzles 121, respectively.

Figure 5:
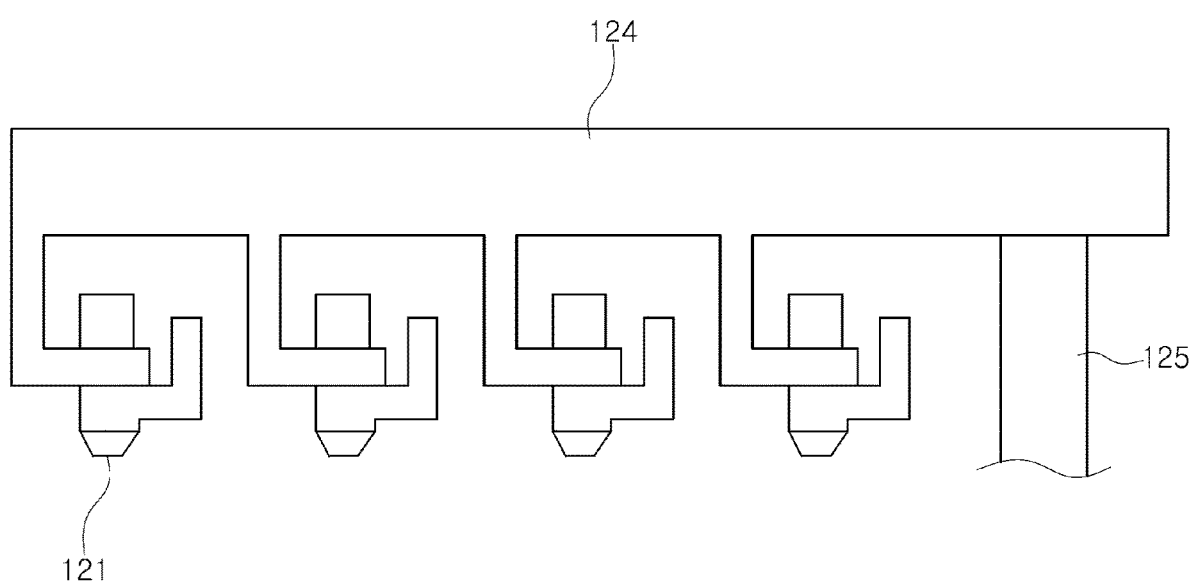
FIG. 5 is a diagram illustrating a spray unit equipped with multiple nozzles.

The spray unit 120 further includes a gripping member 124 and a rotating member 125 (see FIG. 5). The gripping member 124 grips the multiple nozzles 121. The rotating member 125 rotates the gripping member 124.

When one of the nozzles 121 is not used, the rotating member 125 moves the gripping member 124 to a storage position (not shown). On the other hand, when one of the nozzles 121 is used, the rotating member 125 rotates the gripping member 124 so as to be positioned above the substrate W. However, the spray unit 120 includes the gripping member 124 and the rotating member 125 in the case where the spray unit 120 is equipped a single nozzle 121 as well as in the case where the spray unit 120 is equipped with multiple nozzles 121.

A proper gap H (see FIG. 1) between the nozzle 121 and the substrate W is preferably maintained during the process of spraying the dual fluid to the substrate W. When the gap H between the nozzle 121 and the substrate W is excessively large, the jet speed of the dual fluid sprayed from the nozzle is lower than a required jet speed. In this case, it is difficult for the sprayed dual fluid to strongly hit the substrate W, reducing efficiency of removal of foreign particles on the substrate W.

Conversely, when the gap H between the nozzle 121 and the substrate W is small, the jet speed of the dual fluid sprayed from the nozzle does not decrease significantly until the dual fluid reaches the substrate W. Therefore, the dual fluid may strongly hit the substrate W when reaching the substrate W, thereby reliably removing foreign particles T on the substrate W.

Here, the gap H between the nozzle 121 and the substrate W varies depending on the design of the substrate treatment apparatus 100. That is, the gap H is not limited to a specific value.

Although not illustrated in the drawings, the substrate treatment apparatus 100 according to one embodiment of the present invention includes a chemical recovery unit.

The chemical recovery unit is positioned near the support unit 110 and collects a fluid escaping from the support unit 110. In more detail, the chemical recovery unit is installed to surround the entire circumference of the support unit 110 and recovers a fluid scattering from the support unit 110.

The chemical recovery unit may separately recover different fluids used during a surface treatment process. The chemical recovery unit has a plurality of inlets 131 through which various fluids may be introduced into the chemical recovery unit. The inlets 131 are arranged in a vertical direction. That is, the inlets 131 are positioned at different heights.

In a process of treating the substrate W, each of the various fluids may be separately introduced into and stored in a corresponding compartment of multiple compartments in the chemical recovery unit. The fluids introduced into the chemical recovery unit through the respective inlets 131 are separately transferred to an external chemical regeneration unit (not illustrated) through respective recovery pipes, are regenerated by the chemical regeneration unit, and are reused. The chemical regeneration unit is an apparatus for regenerating a fluid so as to be reused. For example, the chemical regeneration unit adjusts the concentration and temperature of the recovered fluid and then filters the resulting fluid.

In the process of treating the substrate W, contaminants such as particles generated during the treatment process may be introduced into the chemical recovery unit or fume may be generated from the remaining fluid in the chemical recovery unit. These contaminants are removed by the chemical regeneration unit. Therefore, it is possible to prevent the substrate from being contaminated in the subsequent substrate treatment process when the recycled fluid is reused.

The chemical recovery unit may be a typical one that is usually used for conventional substrate treatment apparatuses. Therefore, a detailed description of the chemical recovery unit will be omitted.

The substrate treatment apparatus 100 according to one embodiment of the present invention further includes a rotation speed measuring member 130 and a controller 150. In an example embodiment, the rotation speed measuring member 130 may include a tachometer.

The rotation speed measuring member 130 measures the rotation speed of a substrate rotation portion of the support unit 110. In more detail, the rotation speed measuring member 130 is connected to a rotary motor 112 of the support unit 110.

The rotation speed measuring member 130 receives information on the rotation speed from the rotary motor 112 and indirectly detects the rotation speed of the substrate W. Alternatively, the rotation speed measuring member 130 is an RPM sensor that measures the rotation speed of the support plate 111.

The controller 150 controls the number of nozzles 121 to be used on the basis of the rotation speed measured by the rotation speed measuring member 130.

In more detail, when the rotation speed measured by the rotation speed measuring member 130 is lower than a target rotation speed, the controller 150 performs a control operation such that the dual fluid is sprayed to the substrate W from two or more nozzles 121.

Unlike this case, when the dual fluid is sprayed to a center portion of the substrate W from only one nozzle 121 in a state in which the substrate W is rotated at a low speed, it is not possible to obtain a centrifugal force sufficient to spread the dual fluid across the entire surface of the substrate W. Accordingly, a pooling phenomenon in which the dual fluid does not evenly spread over the entire area of the surface but gathers in a limited area occurs.

However, in the case of using the substrate treatment apparatus 100 according to one embodiment of the present invention, since the dual fluid is sprayed from the multiple nozzles 121, although the substrate W is rotated at a low speed, the entire area of the surface including the center portion and the edge portion may be sprayed with a sufficient amount of cleaning agent.

In more detail, when the rotation speed measured by the rotation speed measuring member 130 is higher than the target rotation speed, the controller 150 performs a control operation such that the dual fluid is sprayed to the substrate W from only one nozzle 121. When the substrate W is rotated at a high speed, even though a cleaning agent is sprayed only to a center portion of the surface of the substrate W, the cleaning agent rapidly spreads to cover the entire area of the surface of the substrate W.

In the case in which the cleaning agent is sprayed to the substrate W from only one nozzle 121, the consumption of the cleaning agent is reduced, resulting in reduction in the cost surface treatment of the substrate W.

The substrate treatment apparatus 100 according to one embodiment of the present invention further includes a flow velocity measuring member 140 and a controller 150.

The flow velocity measuring member 140 is installed in the spray unit 120. In more detail, the flow velocity measuring member 140 is installed on the second pipe 122c included in the carbon dioxide supply member 122. The flow velocity measuring member 140 measures the flow velocity of the dual fluid.

The controller 150 controls the pressure of carbon dioxide mixed with the cleaning agent on the basis of the flow velocity of the dual fluid, which is measured by the flow velocity measuring member 140.

The controller may perform a control operation such that the pressure of the carbon dioxide to be mixed with the cleaning agent is increased when the flow velocity measured by the flow velocity measuring member 140 is lower than a target flow velocity. Since the cleaning agent and the carbon dioxide are simultaneously sprayed, the jet speed of the cleaning agent is proportional to the pressure of the carbon dioxide supplied to the nozzle 121.

Thereby, when the pressure of the carbon dioxide supplied to the nozzle is increased, the jet speed of the dual fluid increases so that the dual fluid may strongly hit the surface W when coming into contact with the substrate W. The dual fuel sprayed toward the substrate W at a high velocity strongly strikes foreign particles on the substrate W. Therefore, the foreign particles on the substrate W may be easily removed from the substrate W.

In addition, the substrate treatment apparatus 100 according to one embodiment of the present invention, may supply a sufficient amount (thickness) of cleaning agent to clean the substrate W compared to conventional substrate treatment apparatuses that use steam for cleaning.

On the other hand, the controller may perform a control operation such that a notification indicating that the flow velocity is in a normal state is output when the flow velocity measured by the flow velocity measuring member is equal to or higher than the target flow velocity. The state in which the measured flow velocity is equal to or higher than the target flow velocity means that the dual fluid is sprayed sufficiently fast to remove the foreign particles by the spray unit 120.

The controller 150 may perform a control operation such that an LED lamp installed outside the substrate treatment apparatus flashes or such that a message of "Normal State" is displayed on a display screen to notify the user of the operating state of the surface treatment apparatus. This notification event allows the user to confirm that the substrate treatment apparatus 100 is operating normally.

On the other hand, in the case where a low-pressure low-velocity dual fluid is sprayed onto the substrate W by the spray unit 120, the dual fluid cannot strike the substrate W with a sufficient force so that the substrate W cannot be reliably cleaned. However, since the substrate treatment apparatus 100 according to one embodiment of the present invention is equipped with the flow velocity measuring member 140 and the controller 150, the dual fluid may strike the surface of the substrate W with a sufficiently strong force to completely remove foreign particles on the substrate.

The substrate treatment apparatus 100 according to one embodiment of the present invention may spray a dual fuel toward a substrate at a high velocity, thereby increasing the force of hitting the substrate to increase a cleaning efficiency.

In addition, the substrate treatment apparatus 100 according to one embodiment of the present invention may prevent the concentration of ozone from being reduced by using carbon dioxide, thereby increasing a cleaning efficiency while using a chemical cleaning method. That is, the substrate treatment apparatus 100 according to one embodiment of the present invention may significantly improve the cleaning efficiency by using both physical and chemical methods compared to conventional substrate treatment apparatuses.

The temperature of the cleaning agent used in the substrate treatment apparatus 100 according to one embodiment of the present invention preferably is preferably in a range of 1° to 10°. The substrate treatment apparatus 100 according to one embodiment of the present invention simply mixes a cleaning agent and carbon dioxide and then sprays the resulting mixture to a substrate W as it is unlike conventional substrate treatment apparatuses that typically heat a cleaning agent before spraying the cleaning agent to a substrate W. Therefore, the substrate treatment apparatus 100 according to one embodiment of the present invention may spray a cleaning agent onto a substrate W while maintaining the cleaning agent at a low temperature.

Figure 6:
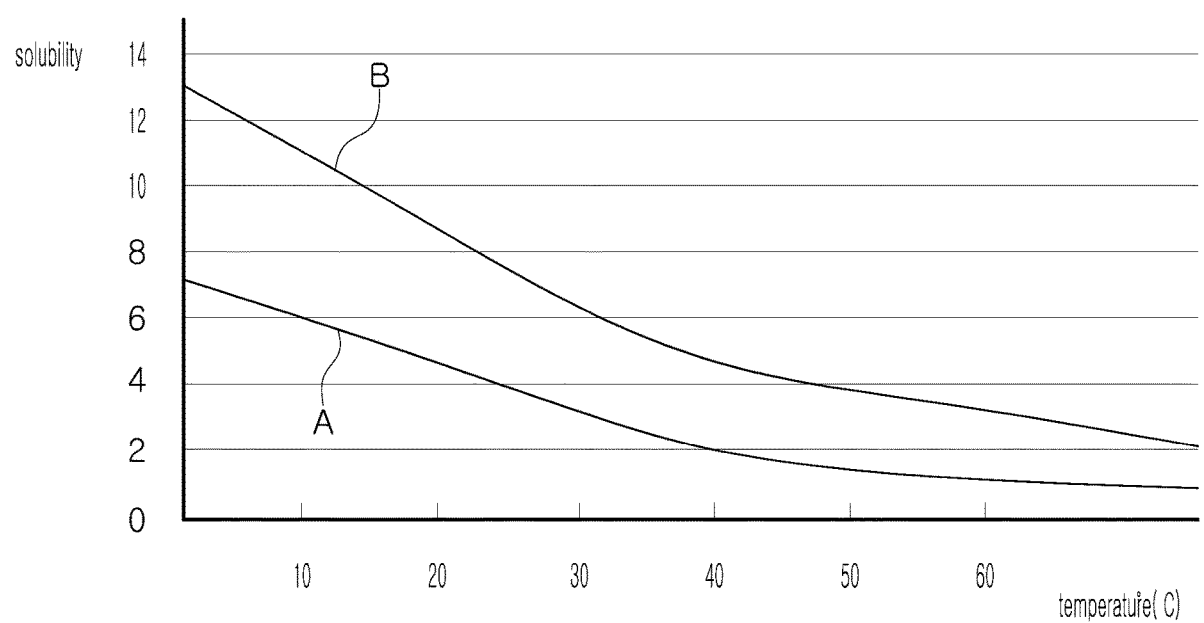
FIG. 6 is a graph illustrating solubility of ozone to water depending on temperature.

Referring to FIG. 6, A is ozone water having an ozone concentration of 1% and B is ozone water having an ozone concentration of 2%. As shown in the graph, the lower the temperature of the ozone water, the greater the solubility of the ozone water.

The substrate treatment apparatus 100 according to one embodiment of the present invention sprays a dual fluid that is a mixture of a low-temperature cleaning agent and carbon dioxide onto the substrate W. Therefore, the dual fluid maintains a high ozone concentration until reaching the surface of the substrate W, thereby efficiently removing foreign particles from the surface of the substrate W. That is, the substrate treatment apparatus 100 according to one embodiment of the present invention exhibits significantly higher cleaning performance than conventional substrate treatment apparatuses.

As described above, the substrate treatment apparatus 100 according to one embodiment of the present invention includes the spray unit 120 that sprays a mixture of a cleaning agent and carbon dioxide to a substrate W. The cleaning performance improves with increasing ozone concentration in the dual fluid. The concentration of ozone may be maintained high until the dual fluid comes into contact with the substrate W after being sprayed from the spray unit 120. The substrate treatment apparatus according to one embodiment of the present invention may increase a cleaning efficiency compared to conventional substrate treatment apparatuses.

The substrate treatment apparatus 100 according to one embodiment of the present invention may spray a dual fuel toward a substrate at a high velocity, thereby increasing the force of hitting the substrate to increase a cleaning efficiency. In addition, the substrate treatment apparatus 100 according to one embodiment of the present invention may prevent the concentration of ozone from being reduced by using carbon dioxide, thereby increasing a cleaning efficiency while using a chemical cleaning method. That is, the substrate treatment apparatus 100 according to one embodiment of the present invention may significantly improve the cleaning efficiency by using both physical and chemical methods compared to conventional substrate treatment apparatuses.

Hereinafter, a substrate treatment method using the substrate treatment apparatus 100 described above will be described.

Figure 8:
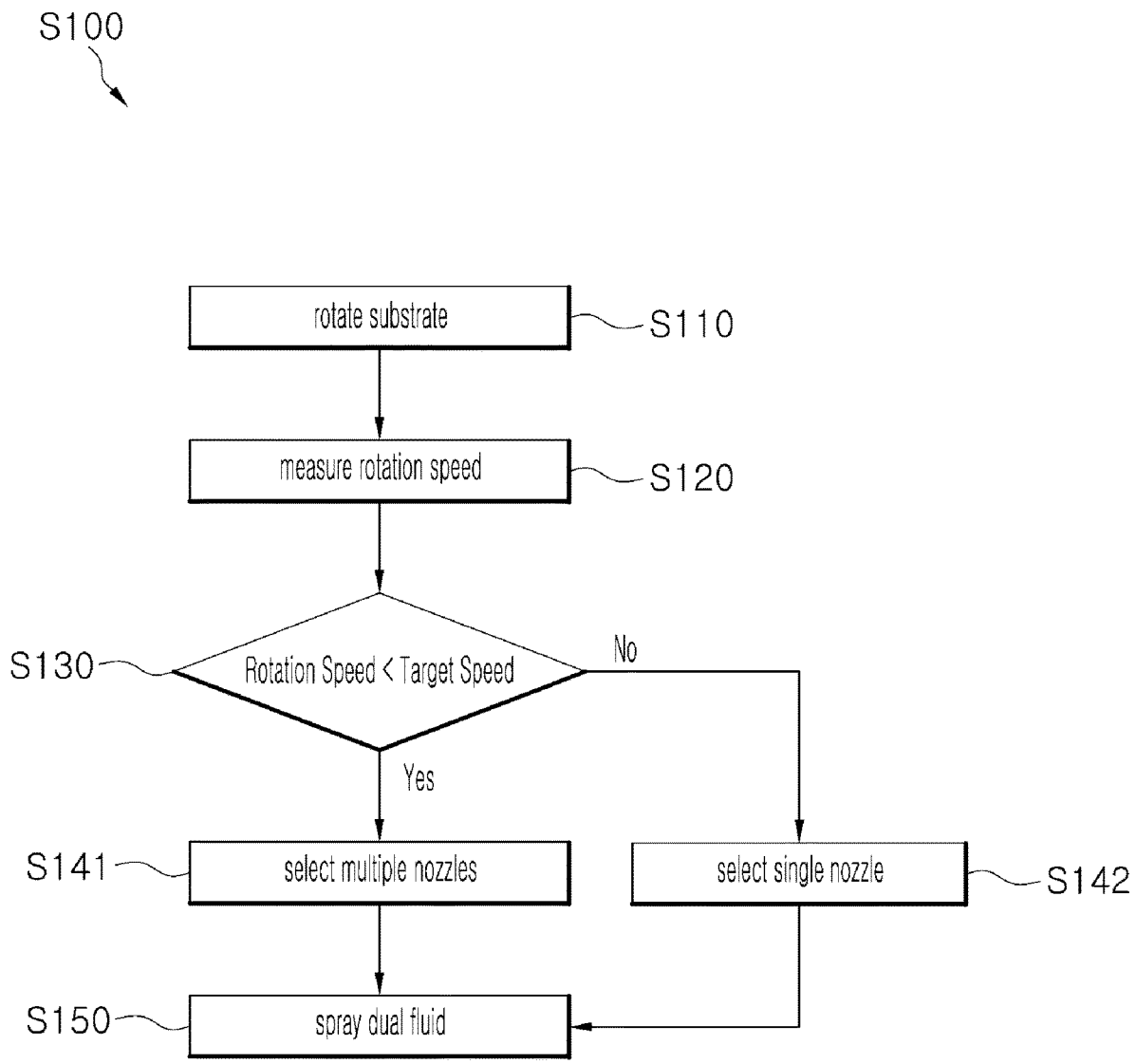
FIG. 8 is a flowchart illustrating a substrate treatment method according to a first embodiment of the present invention.

Referring to FIG. 8, a substrate treatment method S100 according to a first embodiment of the present invention includes a substrate rotation step S110, a rotation speed measurement step S120, a nozzle count determination step S130, and a dual fluid spraying step S150.

The substrate rotation step S110 is a step of rotating a substrate. When the support plate of the support unit is rotated, the substrate supported on the support plate is accordingly rotated.

The rotation speed measurement step S120 is a step of measuring the rotation speed of the substrate.

The nozzle count determination step S130 is a step of setting the number of nozzles to be used on the basis of the measured rotation speed of the substrate. The nozzle count determination step S130 includes a sub-step of selecting two or more nozzles of the nozzles when the measured rotation speed is lower than a target rotation speed. The nozzle count determination step S130 includes a sub-step of selecting one nozzle when the measured rotation speed is higher than the target rotation speed.

The dual fluid spraying step S150 is a step of spraying a dual fluid which is a mixture of cleaning agent and carbon dioxide onto the substrate.

Figure 9:
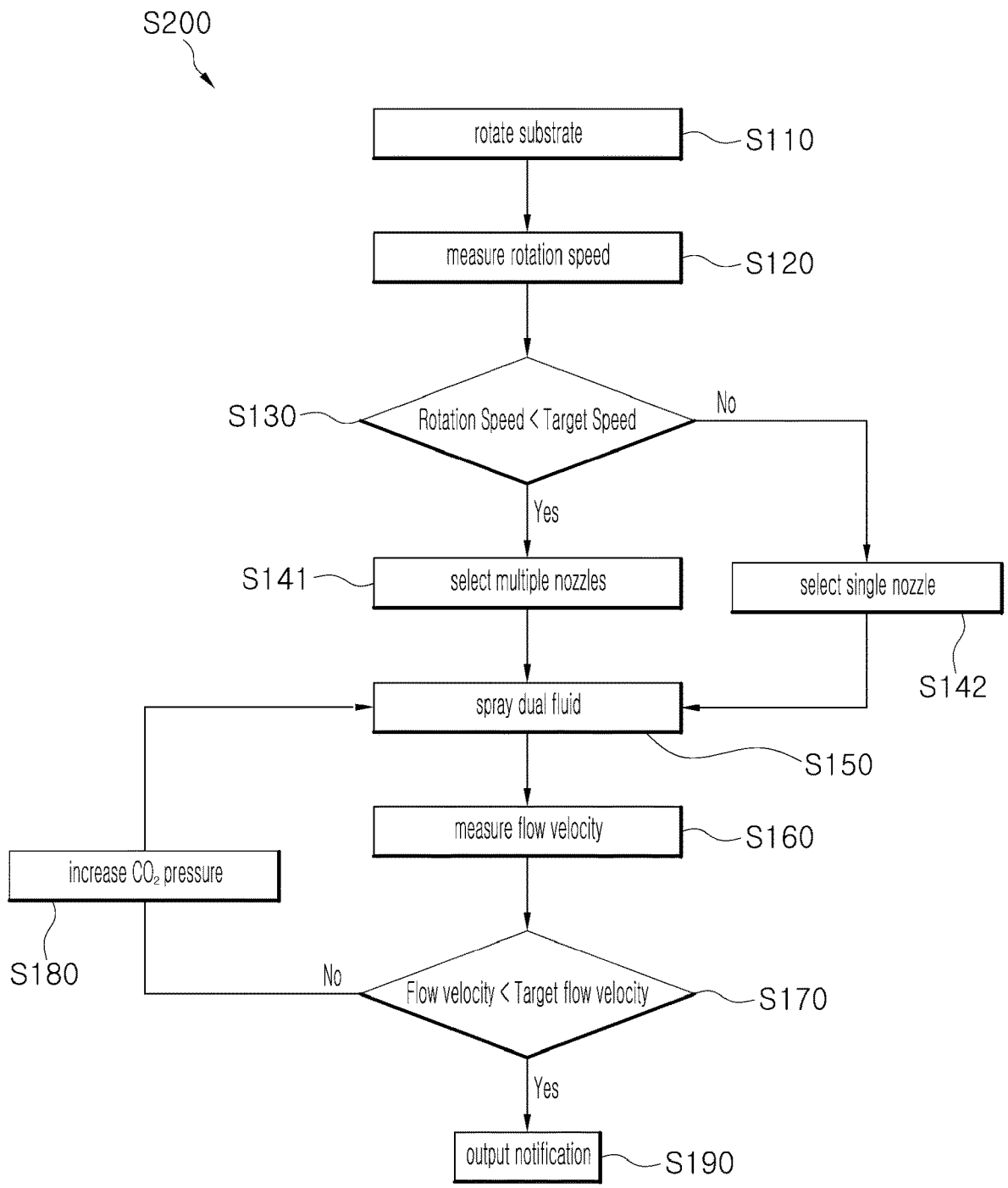
FIG. 9 is a flowchart illustrating a substrate treatment apparatus according to a second embodiment of the present invention.

Referring to FIG. 9, a substrate treatment method S200 according to a second embodiment of the present invention additionally includes a flow velocity measurement step S160 and a pressure control step S170 compared to the substrate treatment apparatus 100.

The flow velocity measurement step S160 is a step of measuring the flow velocity of the dual fluid.

The pressure control step S170 is a step of controlling the pressure of carbon dioxide supplied to the nozzle on the basis of the measured flow velocity.

The pressure control step S170 includes a pressure increasing step S180 of increasing the pressure of carbon dioxide mixed with the cleaning agent when the measured flow velocity is lower than a target flow velocity. Conversely, the pressure control step S190 includes a notification step S190 of outputting a notification indicating that the flow velocity is in a normal state when the measured flow velocity is equal to or higher than the target flow velocity.

The effects and detailed description of the other steps included in the substrate treatment method S200 according to the second embodiment of the present invention will be omitted because they are described above in connection with the substrate treatment apparatus.

Although various embodiments of the present invention have been described above, the drawings and detailed description of the present invention are intended to illustrate the present invention and are not intended to limit the scope of the present invention. Therefore, those skilled in the art will appreciate that various modifications and equivalents thereto are possible. Accordingly, the true technical protection scope of the present invention should be determined by the technical idea defined in the appended claims.

What is claimed is:

1. A substrate treatment apparatus comprising:
 a support unit configured to support a substrate and rotate the substrate supported thereon;
 a spray unit including a plurality of nozzles for spraying a dual fluid composed of a cleaning agent and carbon dioxide onto the substrate;
 a rotation speed measuring member configured to measure a rotation speed of a substrate rotating portion of the support unit; and
 a controller configured to adaptively control the number of nozzles to be used among the plurality of nozzles on the basis of the rotation speed measured by the rotation speed measuring member.

2. The apparatus according to claim 1,
 wherein the spray unit comprises:
 a cleaning agent supply member connected to the plurality of nozzles and configured to supply the cleaning agent to the plurality of nozzles; and
 a carbon dioxide supply member connected to the plurality of nozzles and configured to supply the carbon dioxide to the plurality of nozzles.

3. The apparatus according to claim 1,
 wherein the controller is configured to set, in response to when the rotation speed measured by the rotation speed measuring member is lower than a target rotation speed, the number of nozzles to be used to be two or greater.

4. The apparatus according to claim 1,
 wherein the controller is configured to set, in response to when the rotation speed measured by the rotation speed measuring member is equal to or higher than a target rotation speed, the number of nozzles to be used to be one.

5. The apparatus according to claim 1, further comprising:
 a flow meter installed in the spray unit and configured to measure a flow velocity of the dual fluid; and
 a controller configured to control a pressure of the carbon dioxide to be mixed with the cleaning agent on the basis of the flow velocity measured by the flow meter.

6. The apparatus according to claim 5,
 wherein the controller is configured to cause, in response to the flow velocity measured by the flow meter is lower than a target flow velocity, the pressure of the carbon dioxide to be mixed with the cleaning agent to increase.

7. The apparatus according to claim 5,
 wherein the controller is configured to provide, in response to when the flow velocity measured by the flow meter is equal to or higher than a target flow velocity, a notification indicating that the flow velocity is in a normal state.

8. The apparatus according to claim 1,
 wherein a temperature of the cleaning agent is in a range of 1° C. to 10° C.

9. The apparatus according to claim 1,
 wherein the cleaning agent is ozone water.

* * * * *